United States Patent
Mead et al.

(10) Patent No.: US 10,579,258 B2
(45) Date of Patent: Mar. 3, 2020

(54) CUSTOMIZABLE GESTURE CONTROLLER

(71) Applicant: Honeywell International Inc., Morris Plains, NJ (US)

(72) Inventors: Stephen Mead, Bradenton, FL (US); Keerthi Jayarajan, Coimbatore (IN); Rajendra Prasad Vrukshavai, Bangalore (IN); Sareesh Sivarajan, Bangalore (IN); Satyanarayan Kar, Bangalore (IN)

(73) Assignee: Honeywell International Inc., Morris Plains, NJ (US)

( * ) Notice: Subject to any disclaimer, the term of this patent is extended or adjusted under 35 U.S.C. 154(b) by 12 days.

(21) Appl. No.: 16/036,299

(22) Filed: Jul. 16, 2018

(65) Prior Publication Data

US 2020/0019304 A1    Jan. 16, 2020

(51) Int. Cl.
*G06F 3/0488* (2013.01)
*G06F 3/0481* (2013.01)
*G09G 3/32* (2016.01)
*G06F 3/042* (2006.01)

(52) U.S. Cl.
CPC .......... *G06F 3/04883* (2013.01); *G06F 3/042* (2013.01); *G06F 3/04817* (2013.01); *G09G 3/32* (2013.01); *G06F 2203/04105* (2013.01)

(58) Field of Classification Search
CPC .... G06F 3/0346; G06F 1/1666; G06F 1/1662; H01H 13/83; H04M 1/22
USPC ................................... 345/169–170; 348/114
See application file for complete search history.

(56) References Cited

U.S. PATENT DOCUMENTS

| | | | |
|---|---|---|---|
| 7,083,147 B2 | 8/2006 | Movsesian et al. | |
| 7,623,118 B2 * | 11/2009 | Skillman | G06F 1/1626 345/168 |
| 8,035,621 B2 * | 10/2011 | Joo | H04M 1/22 345/156 |
| 8,525,794 B2 * | 9/2013 | Skillman | G06F 1/1626 345/156 |

(Continued)

FOREIGN PATENT DOCUMENTS

DE   102009042244 A1   3/2011
KR   20040088891 A  *  10/2004

OTHER PUBLICATIONS

Extended European Search Report dated Nov. 19, 2019 in corresponding EP Application No. 19186174.9 (9 pages).

*Primary Examiner* — Michael Pervan
(74) *Attorney, Agent, or Firm* — Bookoff McAndrews, PLLC (57) ABSTRACT

A customizable gesture controller is disclosed for retrofitting and forward-fitting into existing spaces or structures. One embodiment of the controller comprises a controller board configured to host software; a response layer comprising a plurality of sections arranged sequentially, each of the plurality of sections comprising: one or more center LEDs; one or more runway LEDs; and one or more touch sensors; and an overlay comprising: a glass overlay layer; and a graphic overlay layer comprising a plurality of button icons corresponding to the plurality of sections. The response layer further comprises one or more marks positioned at boundaries between each of the plurality of sections, the one or more marks being configured to identify locations at which to adjust lengths of the response layer using an application of force.

20 Claims, 10 Drawing Sheets

(56) References Cited

U.S. PATENT DOCUMENTS

| | | | |
|---|---|---|---|
| 9,546,888 B2 | 1/2017 | Scholten | |
| 2002/0190956 A1* | 12/2002 | Klein | G06F 1/1626 |
| | | | 345/169 |
| 2007/0229319 A1 | 10/2007 | Raisanen et al. | |
| 2009/0231283 A1* | 9/2009 | Polak | G02F 1/133533 |
| | | | 345/169 |
| 2014/0034472 A1* | 2/2014 | Krumpelman | H01H 13/70 |
| | | | 200/5 A |
| 2014/0102873 A1 | 4/2014 | Hu et al. | |
| 2014/0152526 A1 | 6/2014 | Greig et al. | |
| 2015/0102764 A1* | 4/2015 | Leabman | H02J 7/025 |
| | | | 320/107 |
| 2016/0298834 A1 | 10/2016 | Baker et al. | |
| 2018/0049691 A1* | 2/2018 | Nowosielski | A61B 5/0022 |
| 2018/0062648 A1 | 3/2018 | Hirai | |

\* cited by examiner

CUSTOMIZABLE GESTURE CONTROLLER

TECHNICAL FIELD

The present disclosure relates to a gesture controller unit that may be used in a variety of contexts. More particularly, the present disclosure relates to a customizable gesture controller configured to be retro-fit and/or forward-fit into existing spaces or structures.

BACKGROUND

Many passenger aircraft cabins are equipped with personal control units (e.g., gesture controllers) that enable passengers to control various settings related to in-flight entertainment and environment. As every day personal electronic devices (e.g., cellular phones, tablets, electronic watches, etc.) become more advanced with improved functions and graphics, there is a demand from aircraft passengers to have the same experience in-flight with more advanced personal control units having improved functions, graphics and user interface. However, the personal control units are often installed in cabin locations easily accessible to passengers (e.g., embedded in seats, seat armrests, drink rails, etc.) in a manner that is difficult to upgrade or replace without modifying interior finishes and wiring harnesses. Adoption of a personal control unit which does not fit the existing cabin configuration does not have a high acceptance rate due to the cost and time associated with the interior rework.

Therefore, there is a need for a highly customizable personal control unit that can be integrated into existing passenger cabins of various configurations, without requiring any modification of the existing space or wirings. Also, it would be desirable to have a highly customizable personal control unit with further improved functions and display, while minimizing the associated manufacturing cost.

The background description provided herein is for the purpose of generally presenting the context of the disclosure. Unless otherwise indicated herein, the materials described in this section are not prior art to the claims in this application and are not admitted to be prior art, or suggestions of the prior art, by inclusion in this section.

Further, while the background description was provided in the context of an aircraft cabin, it should be appreciated by one of ordinary skill in the pertinent art that the same need may exist in other contexts, including but not limited to motor vehicles (e.g., motorcycles, cars, trucks, buses, etc.), railed vehicles (e.g., trains, trams, subways, etc.), watercraft (e.g., ships, boats, yachts, etc.), spacecraft, buildings, furniture, electronics, and more. Therefore, the exemplary embodiment of the current disclosure may not be limited to aircraft installation, but may also be integrated with other machines, systems, components, or any other environment or context in which the aforementioned need may exist.

SUMMARY OF THE INVENTION

One embodiment provides a customizable controller device comprising: a controller board configured to host software; a response layer comprising a plurality of sections arranged sequentially, each of the plurality of sections comprising: one or more center LEDs; one or more runway LEDs; and one or more touch sensors; and an overlay comprising: a glass overlay layer; and a graphic overlay layer comprising a plurality of button icons corresponding to the plurality of sections, wherein the response layer further comprises one or more marks positioned at boundaries between each of the plurality of sections, the one or more marks being configured to identify locations at which to adjust lengths of the response layer using an application of force.

One embodiment provides a customizable controller device comprising: a response layer comprising: a sensor layer comprising one or more touch sensors, and one or more center holes; and an LED layer comprising one or more center LEDs; an overlay comprising: a glass overlay layer; a graphic overlay layer comprising one or more button icons; and a masking layer comprising one or more center holes; and one or more diffusers, wherein the one or more diffusers are embedded in the one or more center holes of the sensor layer and the one or more center holes of the masking layer.

One embodiment provides a customizable controller device comprising: a controller board configured to host software; a response layer comprising: a sensor layer comprising one or more touch sensors; an LED layer comprising one or more center LEDs; an overlay comprising: a glass overlay layer; a graphic overlay layer comprising one or more button icons; and a masking layer comprising one or more center holes; and a coil layer comprising an induction coil, wherein the coil layer is configured to charge electronic devices wirelessly.

The foregoing and other objects and advantages will appear from the description to follow. In the description reference is made to the accompanying drawings, which form a part hereof, and in which is shown by way of illustration specific embodiments in which the invention may be practiced. These embodiments will be described in sufficient detail to enable those skilled in the art to practice the invention, and it is to be understood that other embodiments may be utilized and that structural changes may be made without departing from the scope of the invention. In the accompanying drawings, like reference characters designate the same or similar parts throughout the several views.

The following detailed description is, therefore, not to be taken in a limiting sense, and the scope of the present invention is best defined by the appended claims.

BRIEF DESCRIPTION OF THE DRAWINGS

Embodiments of the present disclosure will now be described, by way of example only, with reference to the accompanying drawings in which.

DETAILED DESCRIPTION

The following embodiments describe an enhanced gesture controller that is customizable and configured to be retro-fit and/or forward-fit into existing spaces or structures.

Subject matter will now be described more fully hereinafter with reference to the accompanying drawings, which form a part hereof, and which show, by way of illustration, specific exemplary embodiments. An embodiment or implementation described herein as "exemplary" is not to be construed as preferred or advantageous, for example, over other embodiments or implementations; rather, it is intended reflect or indicate that the embodiment(s) is/are "example" embodiment(s). Subject matter be embodied in a variety of different forms and, therefore, covered or claimed subject matter is intended to be construed as not being limited to any exemplary embodiments set forth herein; exemplary embodiments are provided merely to be illustrative. Likewise, a reasonably broad scope for claimed or covered subject matter is intended. Among other things, for example, subject matter may be embodied as methods, devices, components, or systems. Accordingly, embodiments may, for example, take the form of hardware, software, firmware or any combination thereof (other than software per se). The following detailed description is, therefore, not intended to be taken in a limiting sense.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of exemplary embodiments in whole or in part.

Figure 1:
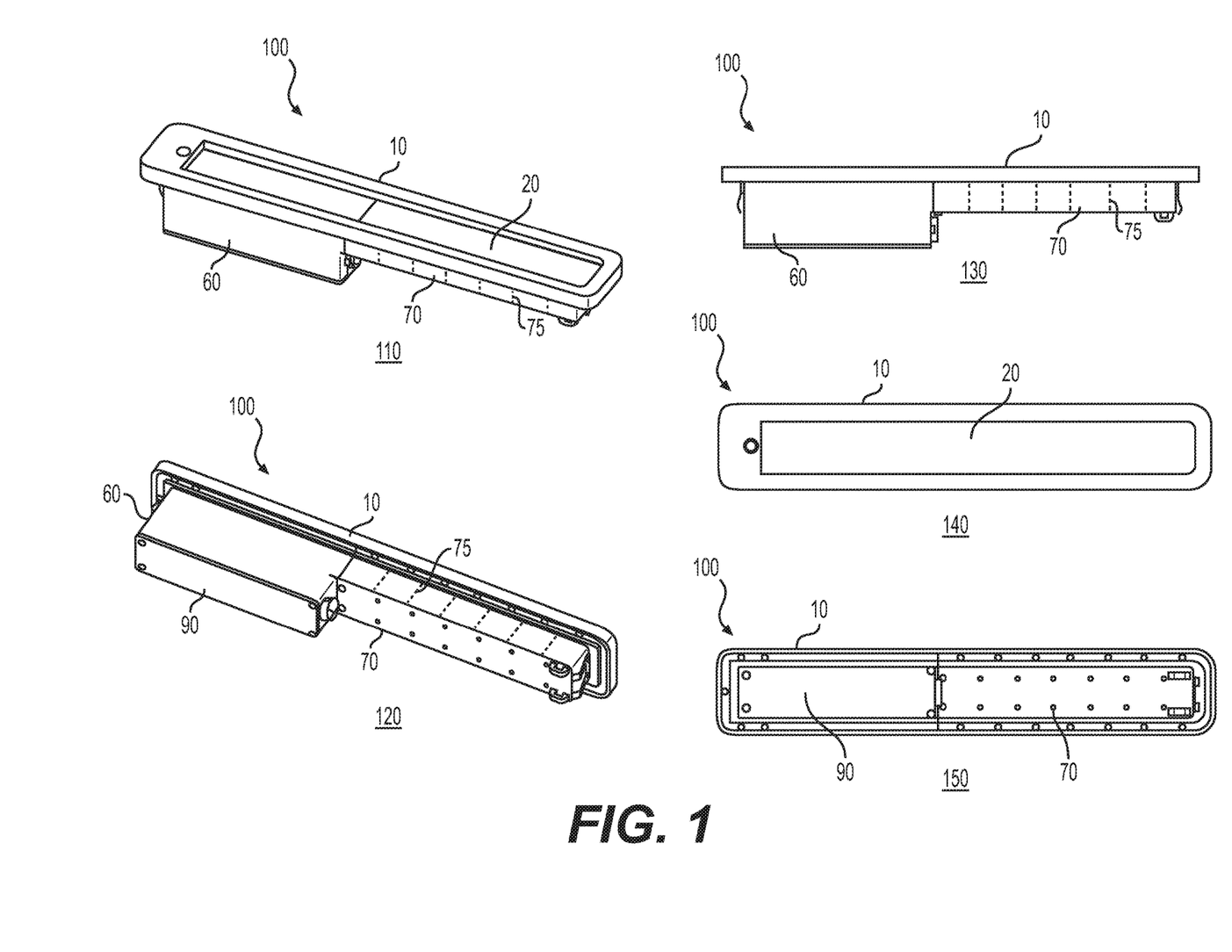
FIG. 1 shows an exemplary customizable controller consistent with embodiments of the present disclosure, viewed from various angles.

Referring now to the appended drawings, FIG. 1 shows an exemplary customizable controller 100 viewed from various angles, including a perspective view from the top (110), a perspective view from the bottom (120), a side view (130), a plan view from the top (140), and a plan view from the bottom (150). The outer components of the customizable controller 100 (e.g., components of the customizable controller 100 that are visible from outside the customizable controller 100) may comprise a bezel 10, an overlay 20, a main chassis 60, an end chassis 70, and a bottom cover 90. Notably, marks 75 may be applied on the outer surfaces of the end chassis 70. The marks 75 may indicate locations at which the length of the end chassis 70 (i.e., the customizable controller 100) may be adjusted, along with the bezel 10, the overlay 20, and other inner components of the customizable controller 100 (e.g., components of the customizable controller 100 that are not visible from outside the customizable controller 100), which will be discussed in detail in the following sections. Throughout this disclosure, the marks may mean perforations, slits, cuts, lines, or any indicia of locations at which the end chassis 70, the bezel 10, the overlay 20, and/or the other inner components of the customizable controller 100 may be cut, snapped, or otherwise re-sized by an application of force.

Figure 2:
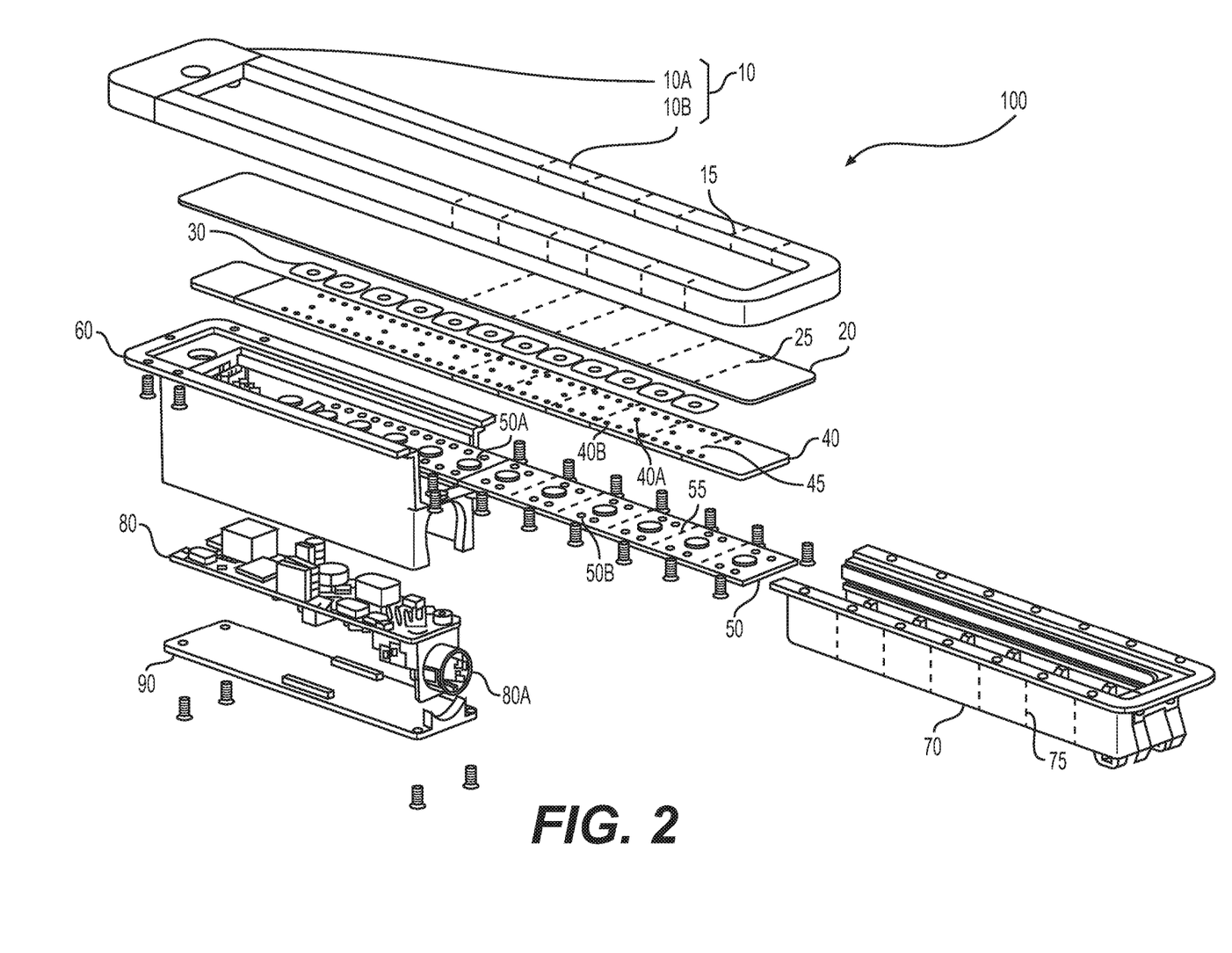
FIG. 2 shows an exploded view of an exemplary customizable controller, consistent with embodiments of the present disclosure.

FIG. 2 shows an exploded view of an exemplary customizable controller 100. In general, FIG. 2 depicts, in addition to the outer components described above with reference to FIG. 1 (e.g., bezel 10, overlay 20, main chassis 60, end chassis 70, and bottom cover 90), the inner components of customizable controller 100, including but not limited to diffusers 30, a sensor board 40, a light-emitting diode (LED) board 50 (e.g., an LED board 50), center LEDs 50A, runway LEDs 50B, and a controller board 80.

Bezel 10 may be installed over the top of the chassis component (i.e., main chassis 60 and end chassis 70 assembled together) and enclose the overlay layer 20, the diffusers 30, the sensor board 40, and the LED board 50. Overlay 20 may be placed below the bezel 10 and above the sensor board 40. Overlay 20 may comprise graphical icons, which may be displayed or illuminated when a user touches the exposed surface of the overlay 20. Although overlay 20 is shown as a single layer in FIG. 2, the overlay 20 may comprise multiple layers vertically stacked together, which will be described in detail in the following sections (e.g., FIG. 3). Diffusers 30 may be placed between the overlay 20 and the sensor board 40. Notably, a portion of each diffuser 30 may be inserted into the overlay 20 and a remaining portion of the diffuser 30 may be inserted into the sensor board 40. Therefore, nearly the entire diffuser 30 may be inserted/embedded into the overlay 20 and the sensor board 40, which will be described in detail in the following sections (FIGS. 4-7).

Sensor board 40 may be placed between the overlay 20 and the LED board 50, and be configured to turn on the LED(s) in the LED board 50 when a touch is detected. Depending on the location at which the touch is detected, one or more corresponding LEDs may be turned on. LED board 50 may be placed below the sensor board 40. LED board 50 may comprise center LEDs 50A along the center of the LED board 50 and runway LEDs 50B along the sides of the LED board 50. Both the center LEDs 50A and the runway LEDs 50B may be configured to change color and brightness, to represent various types of feedback when a user interacts with the customizable controller 100.

Main chassis 60 may house portions of the overlay 20, sensor board 40, and LED board 50 that may not necessarily be cut or snapped. Main chassis 60 may also enclose the controller board 80. End chassis 70, which may be cut or snapped along the marks 75, may house portions of the overlay 20, sensor board 40, and LED board 50 that may be cut or snapped. Both the main chassis 60 and the end chassis 70 may have horizontal grooves or slots inside to allow the overlay 20, the sensor board 40, and the LED board 50 to slide in and/or be held.

Controller board 80 may be placed inside the bottom portion of the main chassis 60 and may host software. The software may be configured using loadable configuration files, such that the software may perform functions suited for a selected context. The configuration files may be stored remotely in a master configuration database, and loaded onto the controller board 80 via wired or wireless connection (e.g., through an interface connector coupled to the controller board 80 via socket 80A). Notably, the size of the controller board 80 may determine the size of the main chassis 60. The controller board 80 may be enclosed in the main chassis 60 by placing the controller board 80 in the open enclosure at the bottom portion of the main chassis 60 and attaching or fixing (e.g., using glues, screws, etc.) a bottom cover 90 to the bottom of the main chassis 60.

Figure 3:
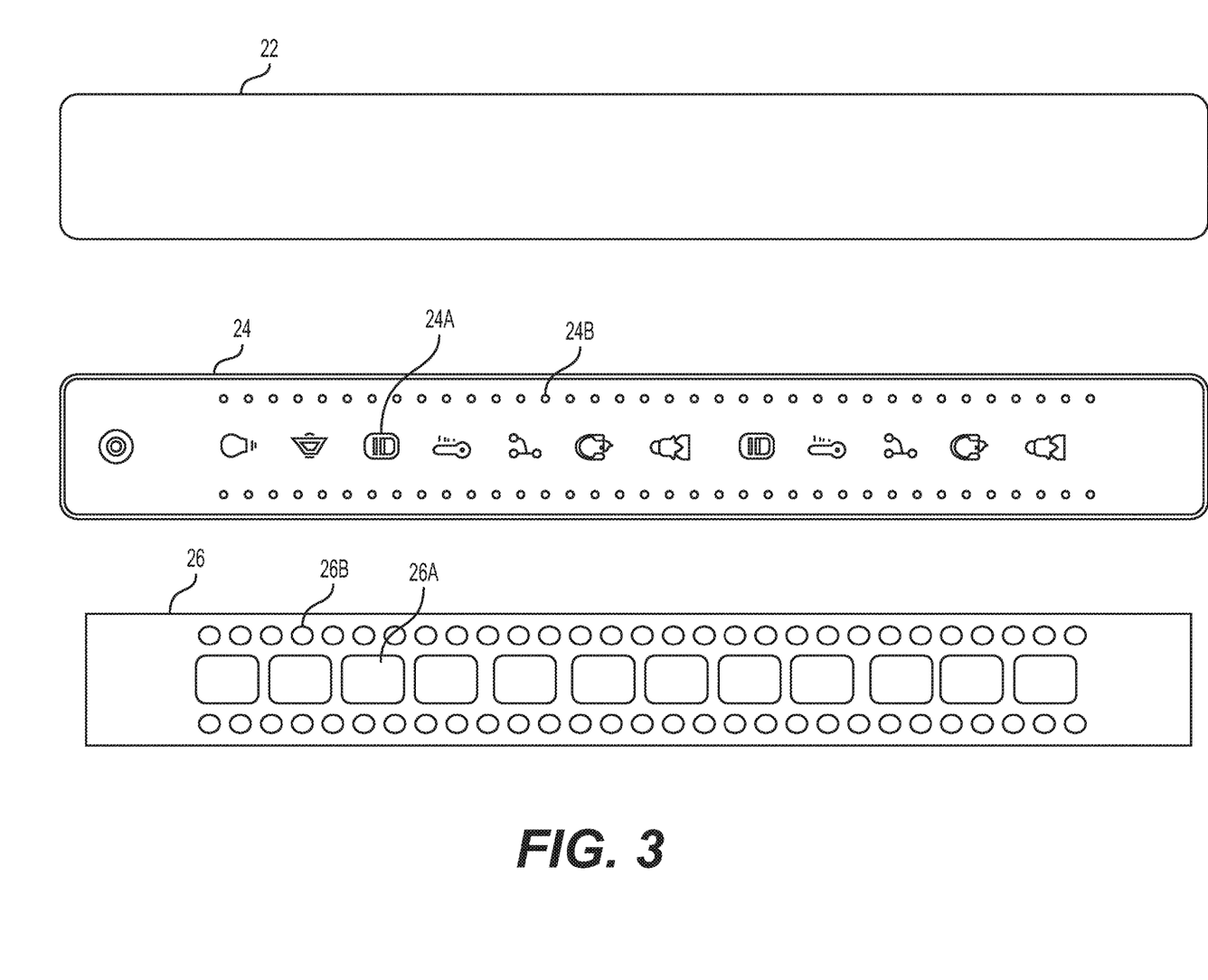
FIG. 3 shows a plan view of an exemplary glass overlay layer, a plan view of an exemplary graphic overlay layer, and a plan view of an exemplary masking layer, all consistent with embodiments of the present disclosure.

The LED board 50, the sensor board 40, and the overlay 20 may have marks 55, 45, 25, at which their respective lengths may be adjusted depending on the installation context (e.g., dimensions of a structure in which the customizable controller 100 is installed, the structure being, for example, a chair, an armrest, a drink rail, etc.). The marks 55, 45, 25 may be in alignment with and/or correspond to each other. However, since overlay 20 may comprise layers that are made of glass or other material that is not suitable to be cut/snapped conveniently during installation, marks 25 of the overlay 20 may not necessarily be present. Instead, the layers forming the overlay 20 (e.g., glass overlay layer 22, graphic overlay layer 24, and masking layer 26 as shown in FIG. 3) may have been pre-cut or manufactured to different lengths such that an overlay 20 having an appropriate length may be installed on top of the sensor board 40, depending on the adjusted lengths of the sensor board 40 and the LED board 50. Further, as discussed above, the end chassis 70 may also have marks 75 at which the length of the end chassis may be adjusted depending on the adjusted lengths of the LED board 50 and the sensor board 40, and/or the overlay 20.

During assembly of the customizable controller 100, the LED board 50, the sensor board 40, and the overlay 20 may be slid in on the slots/grooves of the main chassis 60, and the lengths of the LED board 50, the sensor board 40, and the overlay 20 may be adjusted by cutting/snapping or otherwise re-sizing at the marks 55, 45, 25. In some embodiments, the lengths of the LED board 50, the sensor board 40, and the overlay 20 may be adjusted by cutting/snapping at the marks 55, 45, 25 prior to being placed on the slots/grooves of the main chassis 60. The end chassis 70 may then be cut/snapped to the adjusted lengths and attached (e.g., glued, screwed, etc.) to the main chassis 60 to enclose the LED board 50, the sensor board 40, and the overlay 20. Once the end chassis 70 is installed, the bezel 10 may be attached to the top of the chassis, enclosing the LED board 50, the sensor board 40, and the overlay 20. Notably, the bezel 10 may be a single continuous metal, plastic, or glass frame that is manufactured to desired lengths. Alternatively, the bezel 10 may comprise two individual portions, a head bezel 10A and a body bezel 10B. Among the two portions, the body bezel 10B may be length-adjustable. For instance, the body bezel 10B may also comprise marks 15 at which the length of the body bezel 10B may be adjusted by cutting/snapping, depending on the resulting dimensions of the chassis component (i.e., length-adjusted dimensions of the main chassis 60 and the end chassis 70).

In FIG. 2, the overlay 20 is shown as a single layer. However, as discussed above, the overlay 20 may be composed of multiple layers that are stacked vertically. For example, the overlay 20 may comprise a glass overlay layer 22, a graphic overlay layer 24, and a masking layer 26, as shown in FIG. 3. FIG. 3 illustrates a plan view of a glass overlay layer 22, a graphic overlay layer 24, and a masking layer 26. A glass overlay layer 22 may be placed at the top of the overlay 20, and may be formed of plastic, glass, or any other transparent or semi-transparent material that protects the layers beneath the glass overlay layer 22. From a user stand point, the icons (e.g., button icons 24A and intensity icons 24B) of the graphic overlay layer 24 may be seen through the glass overlay layer 22 when a light is applied to appropriate sections of the graphic overlay layer 24 to illuminate or "turn on" the corresponding icons.

Continuing with FIG. 3, a graphic overlay layer 24 may be placed between the glass overlay layer 22 and the masking layer 26. The graphic overlay layer 24 may comprise button icons 24A and intensity icons 24B, each button icon 24A occupying a section along the center of the graphic overlay layer 24, and each intensity icon 24B occupying a section along the sides of the graphic overlay layer 24. Each section along the center of the graphic overlay layer 24 corresponding to a button icon 24A may be of same, or different dimensions. Similarly, each section along the sides of the graphic overlay layer 24 corresponding to an intensity icon 24B may be of same, or different dimensions. Notably, the icons (e.g., button icons 24A and the intensity icons 24B) may be visible only when a light is applied through the bottom surface of the graphic overlay layer 24. When no light is applied, the icons may not be visible and the entire surface of the overlay 20 may be seen as "black" or "turned off" from a user stand point.

A masking layer 26 may be placed at the bottom of the overlay 20, below the graphic overlay layer 24. The masking layer 26 may be formed of plastic, glass, or any other material that is opaque and optically black, such that no light can transmit the material. In some embodiments, plastic may be preferred over other materials. The masking layer 26 may have runway holes 26B along the sides and center holes 26A along the center, which may fit down on diffusers 30, which will be described in detail in the following sections. Although the runway holes 26B and the center holes 26A are shown as circular and rectangular holes, respectively, the runway holes 26B and the center holes 26A may take any suitable shape (e.g., circular, rectangular, square, oval, diamond, etc.). The runway holes 26B may be positioned in alignment with runway LEDs 50B of the LED board 50 and with intensity icons 24B of the graphic overlay layer 24. Each runway hole 26B may be of a same size as, or slightly larger or slightly smaller than a corresponding intensity icon 24B of the graphic overlay layer 24 (e.g., an intensity icon 24B that is aligned with the runway hole 26B). Through the runway holes 26B, the light from the runway LEDs 50B of the LED board 50 may be transmitted to the sections of the graphic overlay layer 24 corresponding to the intensity icons 24B, and illuminates or "turns on" the intensity icons 24B.

Similarly, the center holes 26A may be placed in alignment with center LEDs 50A of the LED board 50 and with button icons 24A of the graphic overlay layer 24. Each center hole 26A may be of same size as, or slightly larger or slightly smaller than a corresponding button icon 24A of the graphic overlay layer 24 (e.g., a button icon 24A that is aligned with the center hole 26A). Notably, the center holes 26A may fit down on diffusers 30, which may diffuse light from the center LEDs 50A of the LED board 50 and apply light uniformly across each section of the graphic overlay layer 24 corresponding to the button icons 24A. Since the material of the masking layer 26 may be completely opaque, the masking layer 26 may be configured to prevent light leakage. In other words, the making layer 26 may be configured to prevent an LED light targeted for a section of the graphic overlay layer 24 corresponding to a particular icon from leaking into (i.e., bleeding into) other sections of the graphic overlay layer 24 corresponding to other icons.

As discussed with reference to FIG. 2, diffusers 30 may be placed between the overlay 20 and the sensor board 40. Diffusers 30 may be formed of plastic, glass, or any other transparent or semi-transparent material that may diffuse or scatter light from center LED's 50A, such that the light is diffused/scattered uniformly across the entire top surface of each diffuser 30 and applied uniformly to each icon of the graphic overlay layer 24. The material of the diffusers 30 may be "frosted" to diffuse or scatter light.

Figure 4:
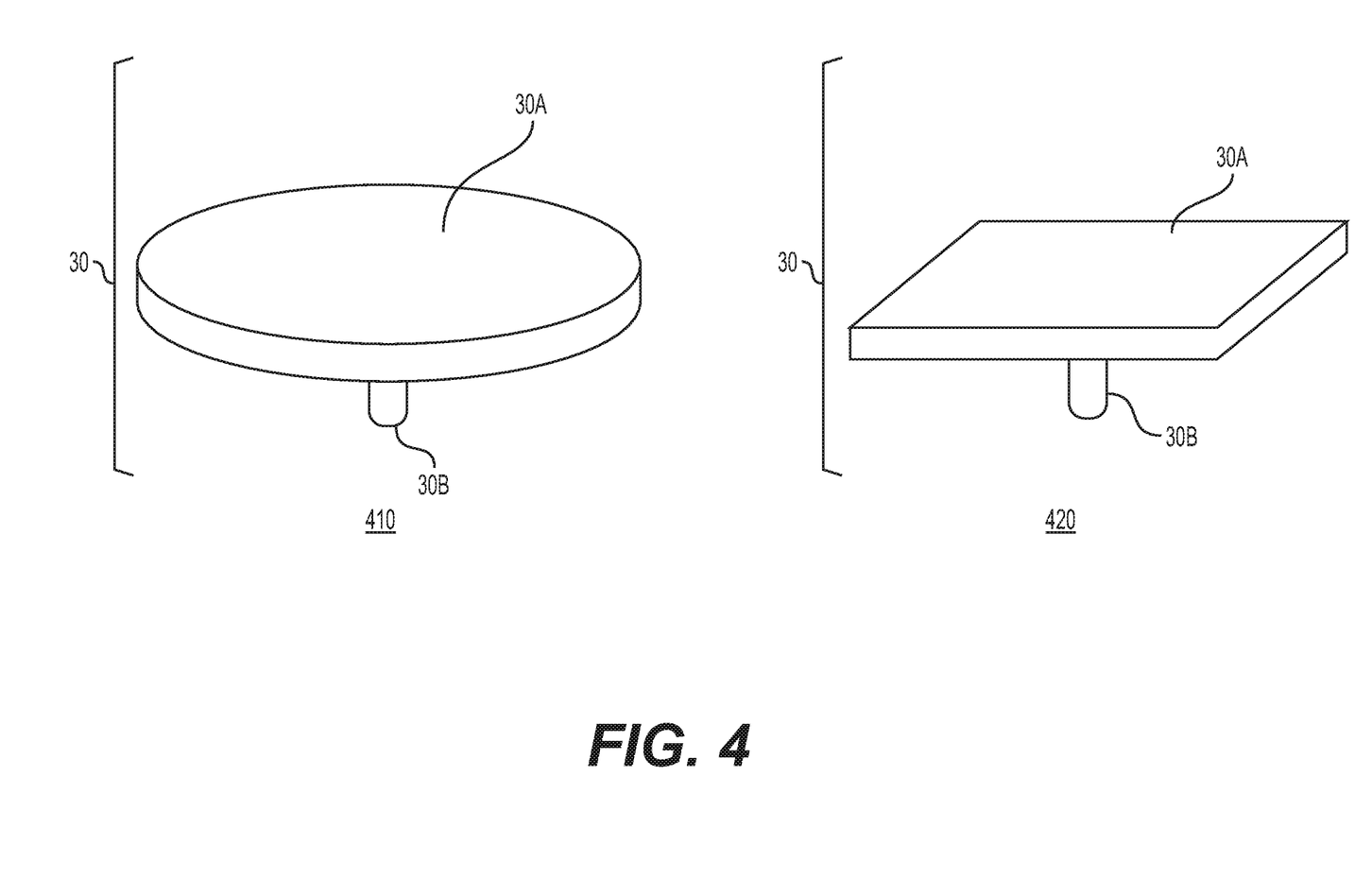
FIG. 4 shows a perspective view of an exemplary diffuser for a customizable controller consistent with embodiments of the present disclosure.
Figure 5:
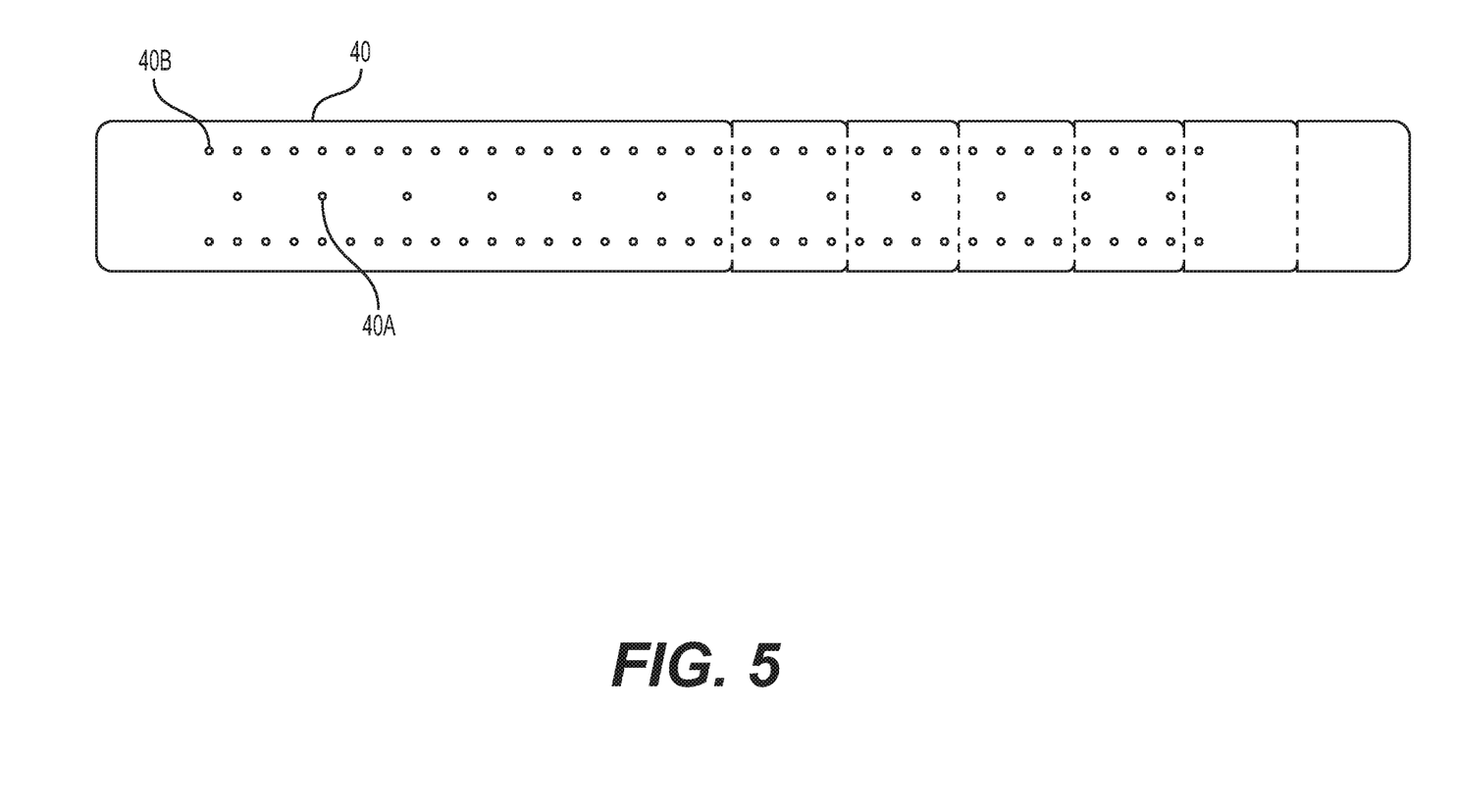
FIG. 5 shows a plan view of an exemplary sensor layer for a customizable controller consistent with embodiments of the present disclosure.

FIG. 4 shows a perspective view of an exemplary diffuser 30. In one embodiment, as seen in diffuser embodiment 410 of FIG. 4, a top portion 30A of the diffuser 30 may be in a circular or oval shape. In another embodiment, as seen in diffuser embodiment 420 of FIG. 4, a top portion 30A of the diffuser may be in a rectangular or square shape (with or without rounded edges). Nonetheless, the top portion 30A of the diffuser 30 may take any size or shape such that the top portion 30A fits into the center holes 26A of the masking layer 26. In other words, the shape of the top portion 30A of the diffuser 30 may depend on the shape of the center holes 26A of the masking layer 26. A bottom portion 30B of the diffuser 30 may also be sized and shaped such that the bottom portion 30B fits into the center holes 40A of the sensor board 40 as shown in FIG. 5. Diffusers may be needed between the LED board 50 and the graphic overlay 24 because the light emitted from each center LED 50A may need to be "expanded" to fully and uniformly illuminate the corresponding button icon 24A.

FIG. 5 shows an enlarged view of an exemplary sensor board 40. In general, FIG. 5 depicts the sensor board 40, center holes 40A and runway holes 40B. The sensor board 40 (i.e., touch sliders) may be any suitable capacitive touch sensor board that is now known or later-developed. The sensors embedded on the sensor board 40 may be copper traces etched on a printed circuit board (PCB) using a diplexing strategy to reduce the number of sensors. Further, the etching may be performed such that the performance and sensitivity of the sensors are not impacted by the ability of the sensor board 40 to be cut/snapped at various lengths. For good interpolation with relatively low number of sensors, chevron-shaped sensors may be preferred over rectangular-shaped sensors. However, rectangular-shaped sensors, or sensors of any shape, may still be used.

Figure 6:
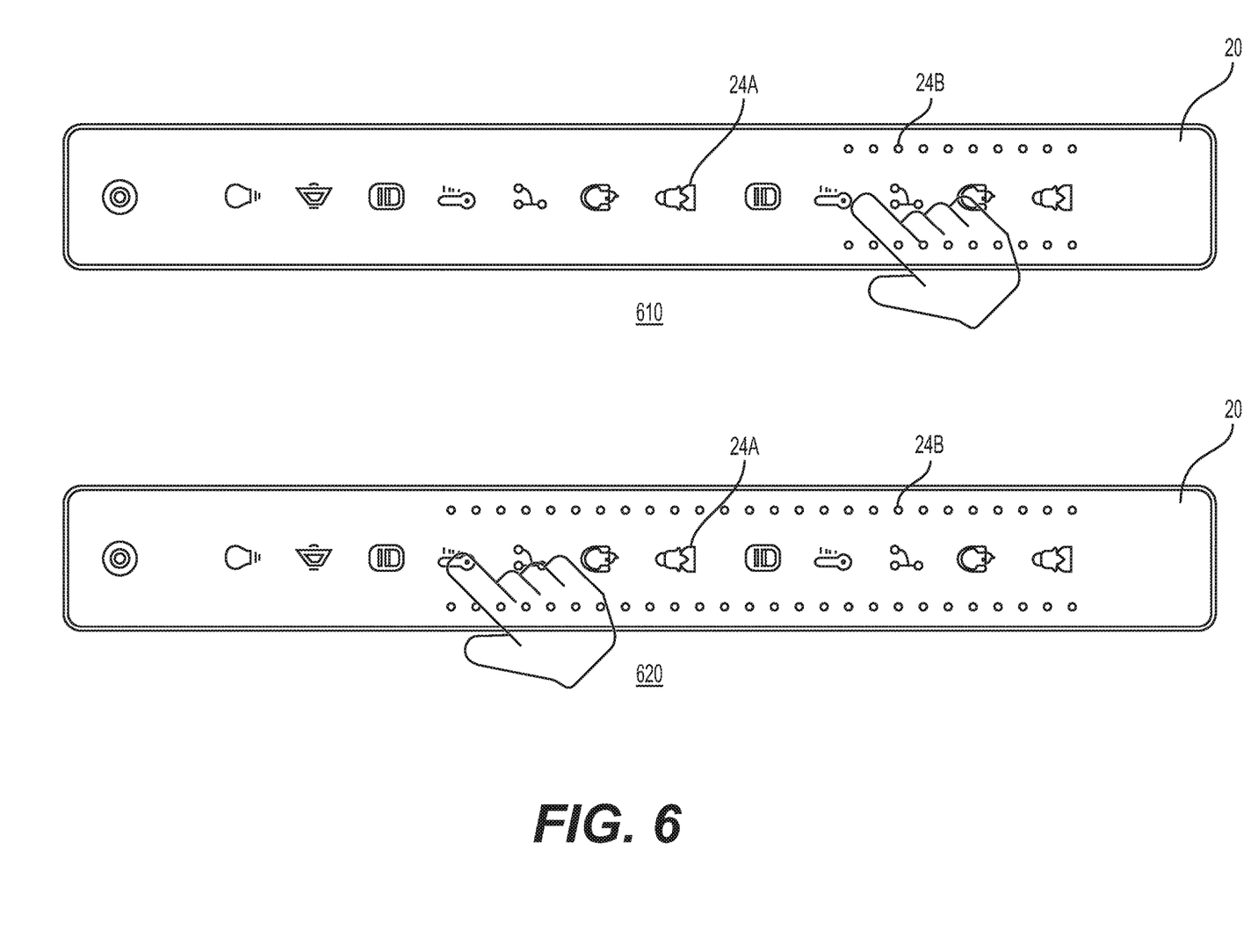
FIG. 6 shows an illustration of an exemplary continuous change value function.

By pressing along the center of the overlay 20, a button icon 24A may be activated and illuminated by turning on an appropriate center LED 50A. If there is an overlap of touch on multiple button icons 24A, the button icon 24A receiving the first touch may be activated. As discussed above, the center LEDs 50A may be configured to show various colors. Therefore, each button icon 24A may be illuminated using a color that is uniquely different from other icons. However, the button icons 24A may also be illuminated using the same color. Among the button icons 24A may be a button for activating a continuous change value function. A continuous change value function may be used in a variety of contexts. For instance, if the user wants to increase or decrease the video/audio volume, the continuous change value function may be activated by touching a volume icon among the button icons 24A. Another example would be when the user wants to increase or decrease the temperature. In this case, the continuous change value function may be activated by touching a temperature icon among the button icons 24A. These contexts are merely exemplary and the use of the continuous change value function may not be limited to these contexts. One of ordinary skill in the art would recognize that the continuous change value function may be used in a variety of contexts not mentioned in the current disclosure. As shown in FIG. 6, once the continuous change value function is activated, the user may touch the overlay 20 with a finger and move the finger up (620) or down (610) the overlay 20 to change and obtain a desired value. As the user moves the finger, the sensor board 40 may provide continuous inputs to the LED board 50, which in turn activates the runway LEDs 50B. In particular, from a user stand point, the intensity icons 24B corresponding to the runway LEDs 50B activated based on the touch motion detected by the sensor board 40 may be turned on and off along the sides of the overlay 20 to indicate the changing value, as shown in FIG. 6. Furthermore, the runway LEDs 50B may be configured to change colors as the value changes, illuminating the intensity icons 24B with varying colors based on the changing value. For example, the color of the intensity icons 24B may gradually change to red as the value increases (e.g., volume or temperature increases) and may gradually change to green as the value decreases (e.g., volume or temperature decreases).

Continuing with FIG. 5, as discussed above, the bottom portion 30B of the diffuser 30 may be placed in the center holes 40A of the sensor board 40. The center holes 40A (and the bottom portions 30B of the diffusers 30) may be in alignment with the center LEDs 50A of the LED board 50, such that the light from the center LEDs may be applied to the diffusers 30 and scattered uniformly across the top portion 30A of the diffusers 30 fitted in the masking layer 26, and illuminate the button icons 24A of the graphic overlay layer 24. Similarly, the side holes 40B may be in alignment with the runway LEDs 50B of the LED board 50, such that the light from the runway LEDs may travel through the runway holes 40B of the sensor board 40 and through the runway holes 26B of the masking layer 26, and illuminate the intensity icons 24B of the graphic overlay layer 24. The center LEDs 50A and the runway LEDs 50B may be positioned on the LED board 50 such that the LED board can be snapped/cut at various lengths, without destroying or otherwise making the LED's inoperative. It is noted that diffusers 30 may not be needed in the runway holes 40B, 26B of the sensor board 40 and the masking layer 26, as the size difference between the intensive icons 24B of the graphic overlay layer 24 and the runway holes 40B, 26B may be negligible, and thus may not require light diffusion to achieve a satisfactory level of illumination for intensity icons 24B. However, in some embodiments, diffusers 30 may be installed along the runway holes 40B, 26B.

As discussed above, the masking layer 26 may prevent light applied to one section of the graphic overlay 24 from leaking into another section of the graphic overlay 24. Therefore, the masking layer 26 may provide a clean visual effect. For example, when a user selects a button icon 24A, only that selected button icon 24A will light up and the light will not bleed into other sections, providing a clean view of the selected button icon 24A.

Figure 7:
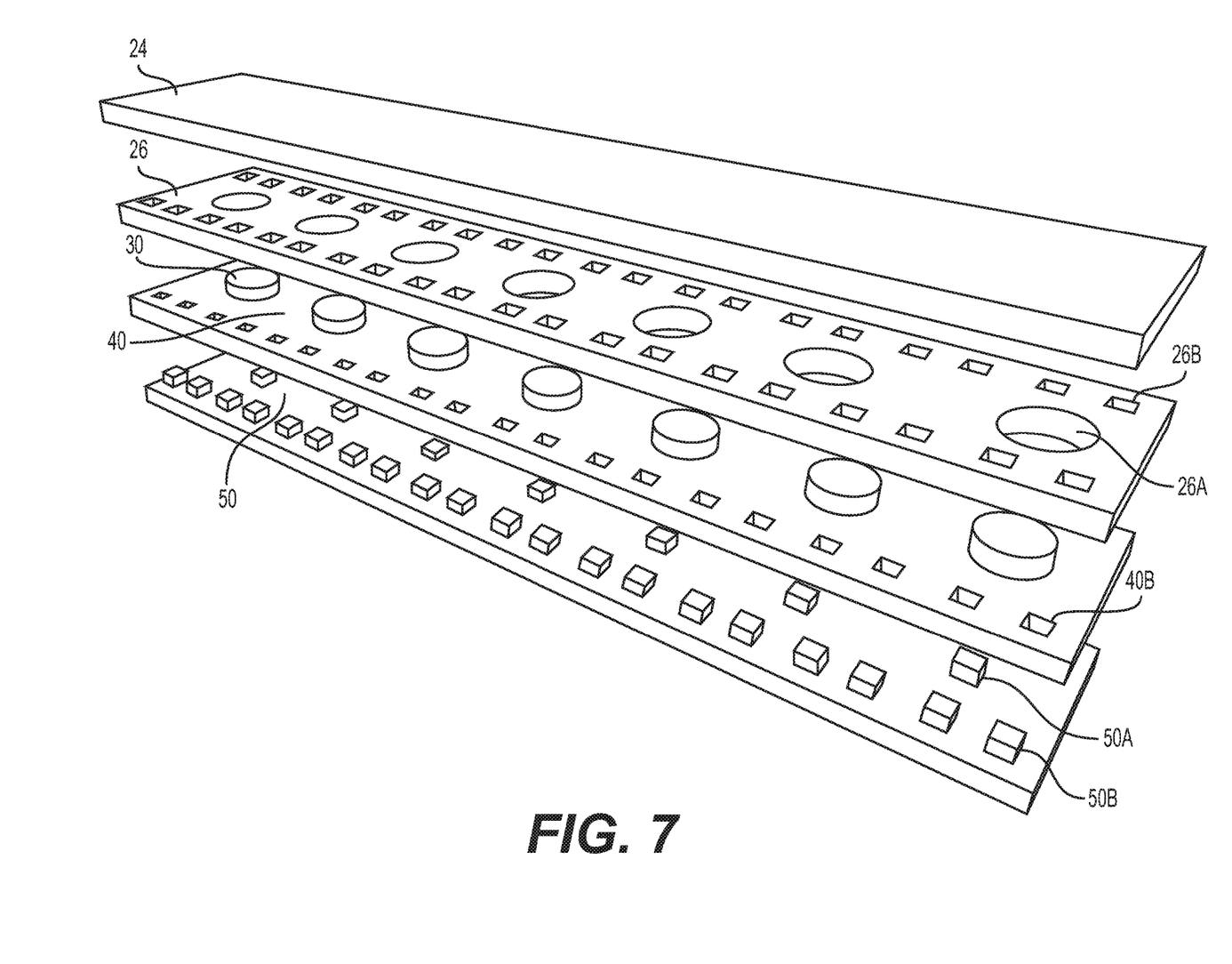
FIG. 7 shows an exploded view of an exemplary graphic overlay layer, masking layer, sensor board, diffusers, and LED board, all consistent with embodiments of the present disclosure.

FIG. 7 shows an exploded view of a graphic overlay layer 24, a masking layer 26, a sensor board 40 with diffusers 30 inserted thereon, and an LED board 50. In general, FIG. 7 illustrates how these components (e.g., a graphic overlay layer 24, a masking layer 26, a sensor board 40 with diffusers 30 inserted thereon, and an LED board 50) are aligned and stacked one on top of another. For the sake of brevity, the icons (e.g., 24A and 24B in FIG. 3) are not shown in FIG. 7 but one of ordinary skill in the pertinent art would recognize that the graphic overlay 24 shown in FIG. 7 may also include the icons 24A and 24B shown in FIG. 3, in alignment with center holes 26A and runway holes 26B of the masking layer 26.

As discussed above, the center LEDs 50A and the runway LEDs 50B of the LED board 50 may be aligned with the center holes 40A (of which the view is obstructed due to the diffusers 30 inserted thereon as shown in FIG. 7) and the runway holes 40B of the sensor board 40, respectively. Then, the center holes 40A (through which the bottom portions 30B of the diffusers 30 are inserted) and the runway holes 40B of the sensor board 40 may be aligned with the center holes 26A and the runway holes 26B of the masking layer 26, respectively. Finally, the center holes 26A (through which the top portions 30A of the diffusers 30 are inserted) and the runway holes 26B of the masking layer 26 are aligned with the button icons 24A and the intensity icons 24B of the graphic overlay layer 24, respectively. Based on the configuration shown in FIG. 7, the light emitted from each LED of the LED board 50 may reach the graphic overlay layer 24 while maintaining brightness to fully and evenly illuminate the corresponding icon (e.g., button icon 24A or intensity icon 24B).

Figure 8:
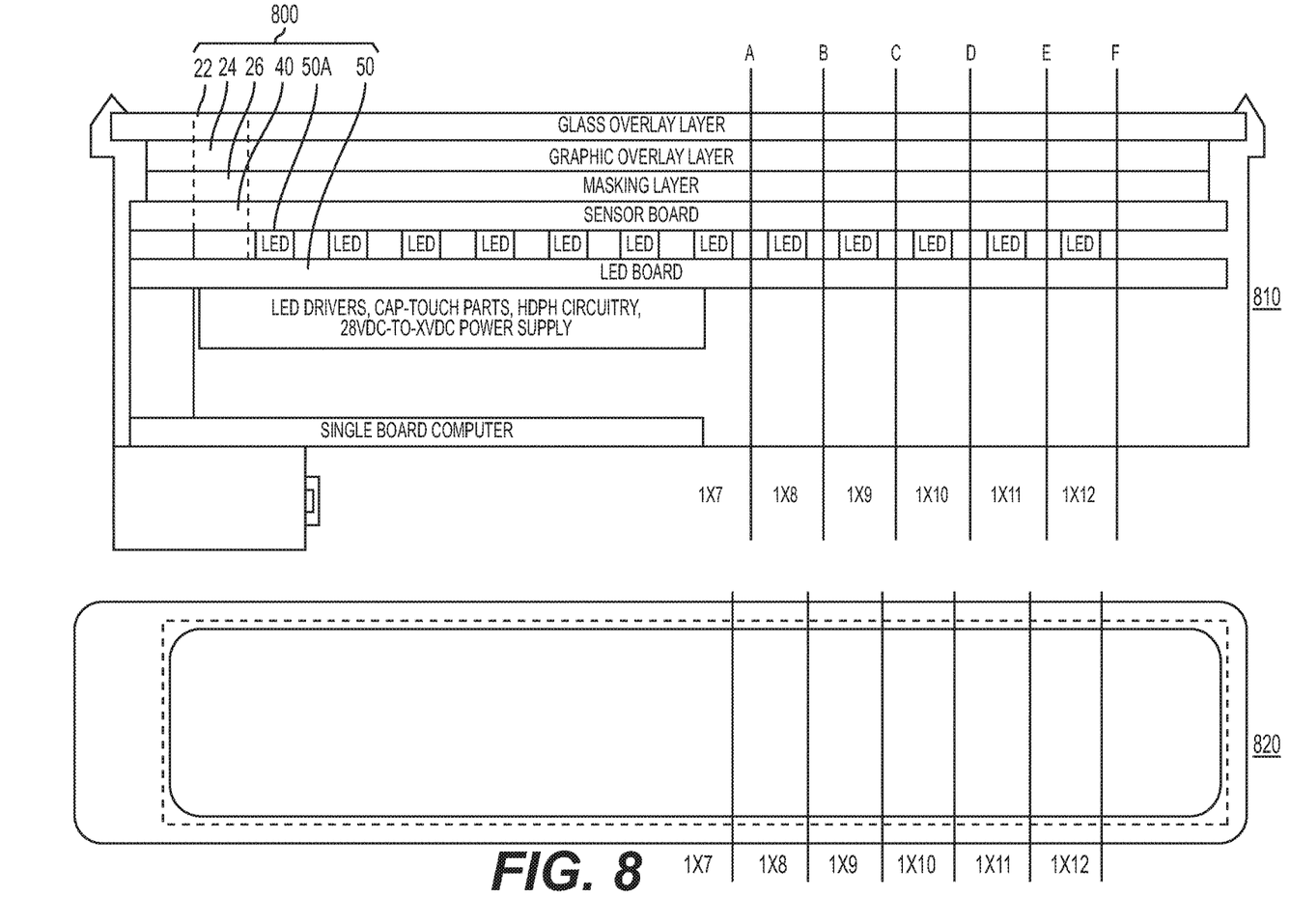
FIG. 8 shows both a cross-sectional view and a top view of an exemplary customizable controller with an illustration of multiple size configurations consistent with embodiments of the present disclosure.
Figure 9:
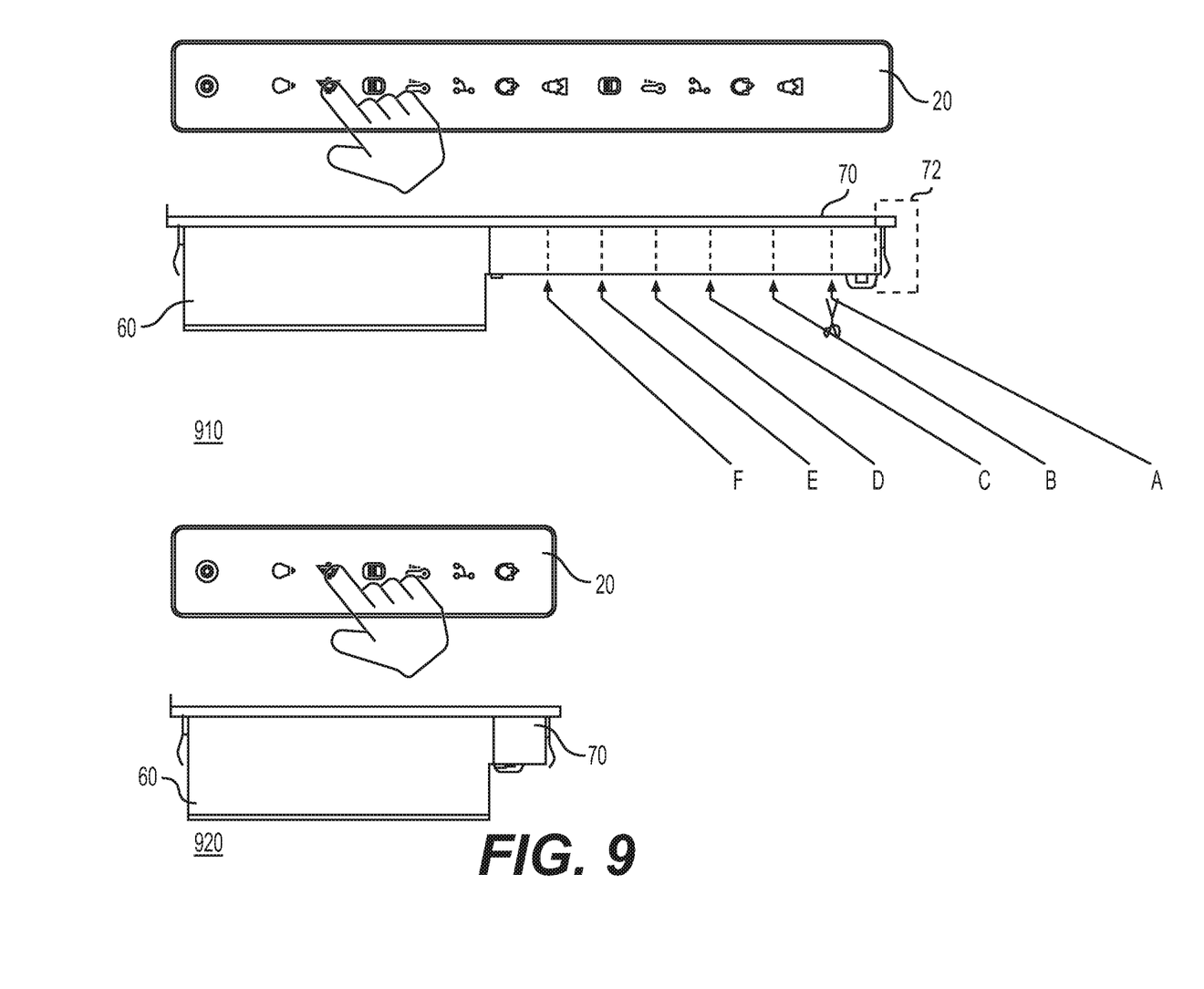
FIG. 9 shows side views of a customizable controller adjusted to maximum and minimum lengths.

FIG. 8 shows a cross-sectional view 810 and a top view 820 of an exemplary customizable controller 100, illustrating various configurations (e.g., lengths) A-F to which the customizable controller 100 may be adjusted. In general, FIG. 3 depicts a glass overlay layer 22, a graphic overlay layer 24, a masking layer 26, a sensor board 40, and an LED board 50 comprising center LEDs 50A and runway LEDs 50B (i.e., stack 800). Because FIG. 8 is an illustration of various configurations to which the customizable controller 100 may be adjusted, runway LEDs 50B are not shown for brevity and to not obscure the lines indicating configurations A-F. The chart below shows exemplary dimensions of the main components (e.g., bezel 10, main chassis 60 and end chassis 70, and the stack 800) in accordance with configurations A-F shown in FIG. 8. The exemplary dimensions (approximate values) in the table below demonstrate the existing needs based on some exemplary, currently-available seats or drink rails in aircrafts, but the customizable controller 100 may not be restricted to these dimensions:

40, LED board 50, etc.) may be cut or snapped at A, and the remaining portion of the end chassis 70 comprising the end cap 72 may be attached (e.g., glued, screwed, etc.) to the main chassis 60.

Figure 10:
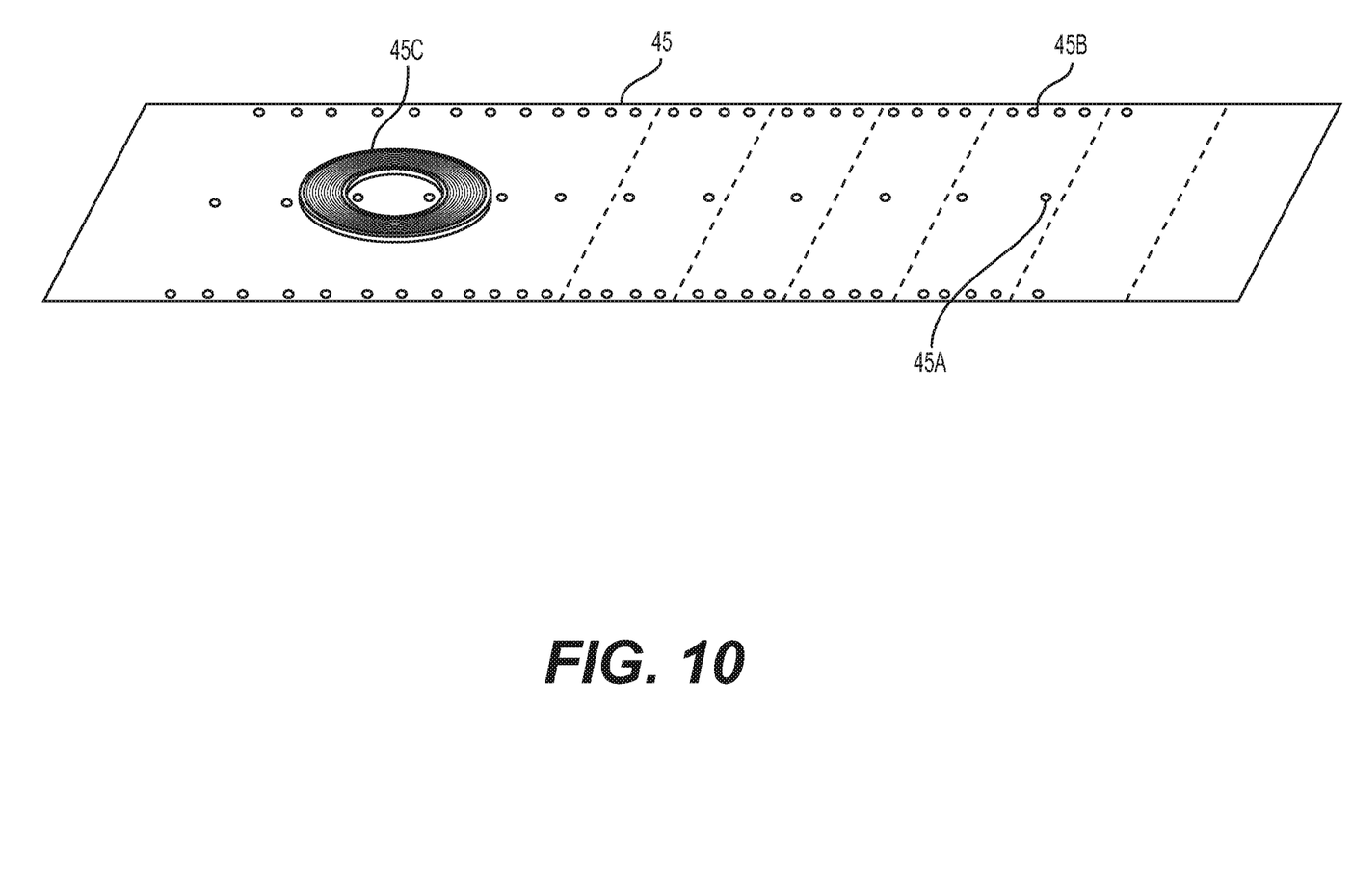
FIG. 10 shows a perspective view of an exemplary coil layer for a customizable controller consistent with embodiments of the present disclosure.

FIG. 10 shows a perspective view of an exemplary coil layer 45. The exemplary coil layer 45 may be optional and placed between the sensor board 40 and the LED board 50 to enable wireless inductive charging for electronic devices, such as cellular phones, electronic watches, and other wireless inductive charging-enabled devices. The coil layer 45 may also comprise holes along the center as well as the sides of the coil layer 45 (e.g., center holes 45A and runway holes 45B), with similar dimensions as the holes 40A, 40B of the sensor board 40, to allow the light from the LED's 50A, 50B to travel through the stack to reach the graphic overlay layer 24. Further, the bottom portions 30B of the diffusers 30 may extend to the bottom ends of the center holes 45A of the coil layer 45.

Wireless inductive charging uses a resonant inductive coupling between a sender device (e.g., charging station) and a receiver device (e.g., electronic device). The sender device uses an induction coil to create an electromagnetic field. The electromagnetic field created by the induction coil induces a current flow in another induction coil in the receiver device, facilitating electrical power transfer between the sender device and the received device. As shown in FIG. 10, the coil layer 45 may comprise an induction coil 45C configured to create an electromagnetic field beyond the housing of the customizable controller 100. More specifically, the induction coil 45C may be configured to inductively couple to another induction coil of an electronic device located within proximity enabled for wireless charging. The induction coil 45C may be positioned within the main chassis 60, away from the portions of the controller

| Configurations | Bezel (inches) | | | Chassis (inches) | | | Panel Cutout (inches) | | |
|---|---|---|---|---|---|---|---|---|---|
| | Height | Width | Depth | Height | Width | Depth | Height | Width | Depth |
| 1 × 6 (A) | 1.28 | 5.55 | 1.5 | 1.084 | 5.15 | 1.6 | 1.084 | 5.25 | 2.1 |
| 1 × 7 (B) | 1.28 | 6.358 | 1.5 | 1.084 | 5.986 | 1.6 | 1.084 | 5.986 | 2.1 |
| 1 × 8 (C) | 1.28 | 7.17 | 1.5 | 1.09 | 6.78 | 1.6 | 1.15 | 6.88 | 2.1 |
| 1 × 9 (D) | 1.28 | 7.982 | 1.5 | 1.084 | 7.61 | 1.6 | 1.094 | 7.59 | 2 |
| 1 × 10 (E) | 1.33 | 8.79 | 1.5 | 1.09 | 8.4 | 1.6 | 1.15 | 8.5 | 2.1 |
| 1 × 11 (F) | 1.28 | 9.606 | 1.5 | 1.09 | 9.21 | 1.5 | 1.094 | 9.214 | 2 |
| 1 × 12 (G) | 1.28 | 10.418 | 1.5 | 1.084 | 10.046 | 1.6 | 1.084 | 10.046 | 2.1 |

FIG. 9 shows side views 910 and 920 of an exemplary customizable controller 100. In general, FIG. 9 shows the customizable controller 100 at its maximum length 910 and at its minimum length 920. In accordance with configurations A-F shown in FIG. 8, the end chassis 70 and the length-adjustable inner components (e.g., sensor board 40, LED board 50, etc.) may be cut or snapped at various points to achieve the desired configuration. For instance, cutting/snapping at point A in FIG. 9 may result in a customizable controller 100 having configuration A discussed with reference to FIG. 8. Similarly, cutting/snapping at point B in FIG. 9 may result in a customizable controller 100 having configuration B discussed with reference to FIG. 8. When the customizable controller 100 is at its maximum length as shown in 910, end chassis 70 along with other length-adjustable inner components (e.g., sensor board 40, LED board 50, etc.) may not be cut or snapped at the marks. On the other hand, when the customizable controller 100 is at its minimum length as shown in 920, end chassis 70 along with other length-adjustable inner components (e.g., sensor board 100 that may be cut or snapped. The coil layer 45 may be directly or indirectly (e.g., via connection with other layers in the stack) connected to a power source, such as through a power cable connected to an AC wall outlet, to provide a source current to the induction coil 45C. Further, a drive circuit may be coupled to the induction coil 45C to receive AC power from an external source (e.g., AC wall outlet) and provide a source current to the induction coil 45C. The drive circuit may also be configured to detect the presence of an electronic device to initiate/terminate wireless charging.

Embodiments of the present disclosure concerning a customizable controller addresses the drawbacks of the prior approaches, using some of the techniques discussed above. In general, the customizable controller in accordance with the embodiments of the present disclosure has at least the following distinguishable features that lead to significant technical improvements:

1) highly customizable controller hardware that can be retrofitted and forward-fitted into diverse configurations, without any modification of existing space or wirings;

2) controller that can be installed easily, providing a cost-effective upgrade path for existing and new customers;

3) highly configurable software which aligns with customizable mechanical/hardware functions;

4) controller with an improved, LCD-like touchscreen providing a cost-effective option alternative to LCD touchscreens; and 5) controller equipped with a unique capability for user convenience, such as wireless charging.

The particular embodiments disclosed above are illustrative only and should not be taken as limitations, as the embodiments may be modified and practiced in different but equivalent manners apparent to those skilled in the art having the benefit of the teachings herein. Accordingly, the foregoing description is not intended to limit the disclosure to the particular form set forth, but on the contrary, is intended to cover such alternatives, modifications, and equivalents as may be included within the spirit and scope of the inventions so that those skilled in the art should understand that they can make various changes, substitutions, and alterations without departing from the spirit and scope of the inventions in their broadest form.

Although various embodiments of the present disclosure have been illustrated and described in detail, it will be readily apparent to those skilled in the art that various modifications may be made without departing from the present disclosure or from the scope of the appended claims.

What is claimed is:

1. A customizable controller device comprising
a controller board configured to host software;
a response layer comprising a plurality of sections arranged sequentially, each of the plurality of sections comprising:
one or more center LEDs;
one or more runway LEDs; and
one or more touch sensors; and
an overlay comprising:
a glass overlay layer; and
a graphic overlay layer comprising a plurality of button icons corresponding to the plurality of sections,
wherein the response layer further comprises one or more marks positioned at boundaries between each of the plurality of sections, the one or more marks being configured to identify locations at which to adjust lengths of the response layer using an application of force.

2. The customizable controller device of claim 1, wherein the controller board is further configured to load configuration files from a remote storage device.

3. The customizable controller device of claim 1, wherein the one or more marks are perforations.

4. The customizable controller device of claim 1, wherein the response layer comprises:
a sensor layer comprising the plurality of touch sensors; and
an LED layer comprising the center LEDs and the runway LEDs.

5. The customizable controller device of claim 4, wherein the sensor layer comprises a first set of one or more marks positioned at boundaries between each of the plurality of sections, and the LED layer comprises a second set of one or more marks positioned at boundaries between each of the plurality of sections, wherein the first set of one or more marks and the second set of one or more marks are aligned.

6. The customizable controller device of claim 4, wherein the sensor layer comprises:

a plurality of center holes aligned with the center LEDs; and
a plurality of runway holes aligned with the runway LEDs.

7. The customizable controller device of claim 4, further comprising a plurality of diffusers.

8. The customizable controller device of claim 7, wherein the overlay further comprises a masking layer, and wherein the plurality of diffusers are embedded between the masking layer and the sensor layer.

9. The customizable controller device of claim 1, wherein the overlay further comprises a masking layer comprising:
a plurality of center holes aligned with the center LEDs; and
a plurality of runway holes aligned with the runway LEDs.

10. The customizable controller device of claim 1, further comprising:
a main chassis; and
an end chassis,
wherein the main chassis and the end chassis enclose the response layer and the overly.

11. The customizable controller device of claim 10, wherein the end chassis comprises one or more marks being configured to identify locations at which to adjust lengths of the end chassis using an application of force.

12. The customizable controller device of claim 11, wherein the one or more marks of the end chassis are aligned with the one or more marks of the response layer.

13. The customizable controller device of claim 1, wherein the graphic overlay layer further comprises a plurality of intensity icons, and wherein the plurality of buttons icons are placed along a center of the graphic overlay layer and the plurality of intensity icons are placed along sides of the graphic overlay layer.

14. The customizable controller device of claim 13, wherein the plurality of button icons are aligned with the center LEDs and the plurality of intensity icons are aligned with the runway LEDs.

15. A customizable controller device comprising
a response layer comprising:
a sensor layer comprising
one or more touch sensors, and
one or more center holes; and
an LED layer comprising one or more center LEDs;
an overlay comprising:
a glass overlay layer;
a graphic overlay layer comprising one or more button icons; and
a masking layer comprising one or more center holes; and
one or more diffusers,
wherein the one or more center LEDs of the LED layer, the one or more center holes of the masking layer, and the one or more button icons of the graphic overlay layer are aligned, and
wherein the one or more diffusers are embedded in the one or more center holes of the sensor layer and the one or more center holes of the masking layer.

16. The customizable controller device of claim 15, wherein material of the masking layer is opaque and does not transmit light other than through the one or more center holes.

17. The customizable controller device of claim 15, wherein a size of each of the one or more center holes of the masking layer is larger than a size of each of the one or more center holes of the sensor layer.

18. A customizable controller device comprising
a controller board configured to host software;
a response layer comprising:
  a sensor layer comprising one or more touch sensors;
  an LED layer comprising one or more center LEDs;
an overlay comprising:
  a glass overlay layer;
  a graphic overlay layer comprising one or more button icons; and
  a masking layer comprising one or more center holes; and
a coil layer comprising an induction coil, wherein the coil layer is configured to charge electronic devices wirelessly.

19. The customizable controller device of claim 18, further comprising one or more diffusers positioned between the sensor layer and the masking layer.

20. The customizable controller device of claim 18, wherein the masking layer is opaque.

* * * * *